(12) United States Patent
Choi et al.

(10) Patent No.: US 6,249,461 B1
(45) Date of Patent: Jun. 19, 2001

(54) FLASH MEMORY DEVICE WITH A STATUS READ OPERATION

(75) Inventors: Ki-Hwan Choi, Kyunggi-do; Jong-Min Park, Suwon, both of (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/593,260

(22) Filed: Jun. 13, 2000

(30) Foreign Application Priority Data

Jun. 22, 1999 (KR) .................................................. 99-23429
May 23, 2000 (KR) .................................................. 00-27603

(51) Int. Cl.[7] .................................................. G11C 16/00
(52) U.S. Cl. .............................. 365/185.33; 365/189.05; 365/189.11
(58) Field of Search .................. 365/185.33, 189.01, 365/189.05, 189.11

(56) References Cited

U.S. PATENT DOCUMENTS 5,640,349 * 6/1997 Kakinuma ....................... 365/185.33
5,893,135 * 4/1999 Hasbun et al. .................. 365/189.05
6,067,598 * 5/2000 Roohparvar et al. ........... 365/185.33

* cited by examiner

Primary Examiner—Tan T. Nguyen
(74) Attorney, Agent, or Firm—Marger Johnson & Mccollom, P.C.

(57) ABSTRACT

Is herein disclosed a flash memory device which provides a status read operation for indicating its status of operation. In the flash memory device, a first group of data output circuits are coupled to first data input/output pins each of which outputs a status data signal associated with the status read operation. A second group of data output circuits are coupled to second data input/output pins each of which is reserved during the status read operation. A data output circuit coupled to at least one of the first data input/output pins generates a toggled status data signal so that the toggled status data signal to be outputted via the at least one pin at an Nth cycle of an output enable signal is generated at a (N-1)th cycle of the output enable signal during the status read operation. Each of the second data input/output pins is maintained at a predetermined state(e.g., '1', '0' or Hi-Z) by a corresponding data input/output circuit during the status read operation.

7 Claims, 9 Drawing Sheets

FLASH MEMORY DEVICE WITH A STATUS READ OPERATION

This application relies for priority upon Korean Patent Application No. 1999-23429, filed on Jun. 22, 1999 and No. 2000-27603, filed on May 23, 2000, the contents of which are herein incorporated by reference in their entirety.

FIELD OF THE INVENTION

The present invention is related to semiconductor memory devices, in particular, to a flash memory having means to indicate its status of operation.

BACKGROUND OF THE INVENTION

Electrically erasable and programmable flash memory of a conventional type is illustrated in FIG. 1 in a block form. The memory is disclosed in a data book, entitled "Flash Memory", published by SAMSUNG ELECTRONICS CO. Ltd, 3, 1998. As shown in FIG. 1, the flash memory includes an array 10 of electrically erasable and programmable memory cells, which are arranged at intersections of plural word lines and plural bit lines (not shown). One of the memory cells is schematically illustrated in FIG. 2. A memory cell of the electrically erasable and programmable flash memory comprises a cell transistor or a floating gate transistor, which has a source and a drain each formed in a p-type semiconductor substrate or a bulk, a floating gate formed over a channel region between the source and the drain with an insulator interposed therebetween, and a control gate formed over the floating gate with another insulator interposed therebetween.

The flash memory further comprises a row-address buffer & latch circuit 20, a column-address buffer & latch circuit 30, a pre decoder circuit 40, a row selector circuit 50, a column selector circuit 60. A row of memory cells in the array 10 is selected by the row selector circuit 50 according to address signals which are provided from the row-address buffer & latch circuit 20 via the pre decoder circuit 40. Columns of memory cells therein are selected by the column selector circuit 60 according to address signals which are provided from the column-address buffer & latch circuit 30 via the pre decoder circuit 40.

Each of the memory cells in the selected row and columns is programmed under the bias condition that a ground voltage (e.g., 0 V) is applied to its source and its substrate, a high voltage (e.g., +10 V from a program voltage generator 90) to its control gate, and a positive voltage (e.g., +5 V to +6 V) suitable to generate hot electrons to its drain. According to the bias condition, the sufficient amount of negative charges is accumulated in the floating gate and thereby the floating gate has (−) potential. This forces the threshold voltage of the programmed cell transistor to be increased during a read operation. During the read operation, a state of the memory cell is discriminated by a sense amplifier 110 as an "OFF" state, and its threshold voltage is distributed in a range of +7 V to +9 V, as shown in FIG. 3. The above-described program operation is performed under the control of a control logic & command register circuit 70.

As well known, the array 10 of the flash memory is divided into a plurality of sectors. The bulk regions of the respective sectors are electrically separated from each other, and memory cells integrated in each sector are simultaneously erased during an erase operation.

Each of memory cells in a selected selector is erased by the Fowler-Nordheim tunneling mechanism. According to the F-N tunneling mechanism, a negative high voltage (e.g., −10 V from an erase voltage generator 100) is applied to the control gate, a positive voltage (e.g., +5 V to +6 V) suitable to make the F-N tunneling is applied to the semiconductor substrate of the bulk, and the source and the drain are maintained at a floating state. The erase operation of such a bias condition is referred to as "Negative Bulk and Gate Erase" operation. By the bias condition, strong electric field of 6 to 7 MV/cm is made between the control gate and the semiconductor substrate. As a result, negative charges accumulated in the floating gate are discharged through the insulator having the thickness of about 100 $_{66}$ (angstrom). This makes the threshold voltage of the erased cell transistor lowered during the read operation. During the read operation, a state of the memory cell is discriminated by the sense amplifier 110 as an "ON" state, and its threshold voltage is distributed in a range of +1 V to +3 V, as illustrated in FIG. 3. Similarly, the above-described erase operation is performed under the control of the control logic & command register circuit 70.

As well known in the art, a time required to erase memory cells in a sector and to program memory cells is longer than that required to read data from memory cells. For instance, an erase time is about one second, a read time is about 100 ns (nanosecond), and a program time is about 10 us (microsecond). In the flash memory is provided a suspend mode of operation in which an erase operation for a sector is suspended while a program or read operation for another sector can be performed. That is, the suspend mode of operation is provided to the flash memory as a system interrupt function. The suspended erase operation is resumed after completing the read or program operation for another sector.

In the flash memory is also provided a status read operation in order for an user to confirm its status of operation. The status of operation for the flash memory can be judged to use values of five data input/output pins DQ2, DQ3, DQ5, DQ6, and DQ7 or a value of a pin R/B#. The symbol # is to indicate an active low signal. During the status read operation, the values of the data input/output pins are changed as an output enable signal OE# is toggled in synchronization with a read timing. The statuses are as follows.

TABLE 1

| Operation | DQ7 | DQ6 | DQ5 | DQ3 | DQ2 | R/B# |
| --- | --- | --- | --- | --- | --- | --- |
| Standard Mode | | | | | | |
| Program | DQ7# | Toggle | 0 | N/A | No toggle | 0 |
| Erase | 0 | Toggle | 0 | 1 | Toggle | 0 |
| Erase Suspend Mode | | | | | | |
| Read within erase suspended sector | 1 | No toggle | 0 | N/A | Toggle | 1 |
| Read within non-erase suspended sector | Data | Data | Data | Data | Data | 1 |
| Erase suspend program | DQ7# | Toggle | 0 | N/A | N/A | 0 |

In the table, a symbol N/A indicates "not available". As shown in the table, the values of the pins R/B#, DQ2, DQ3, DQ5, DQ6, and DQ7 are toggled or maintained at a previous value according to a mode of operation. As illustrated in FIG. 4, for example, when an erase operation is performed, the values of the pins DQ2 and DQ6 are toggled as the signal OE# is toggled. When an erase operation is suspended and then a read operation is performed, the value of the pin DQ2 is toggled while the value of the pin DQ6 is maintained at a previous state. As seen from the above description, the status read operation is performed by toggling the signal OE# after an input of a command for an erase/program operation.

FIG. 5 shows an output enable buffer illustrated in FIG. 1. The output enable buffer 130 is composed of a NOR gate G1 and two inverters INV1 and INV2 connected as illustrated in FIG. 5. When the output enable signal OE# is at a high level as an inactive state, output signals POE and OE have a low level, respectively. On the other hand, when the output enable signal OE# is at a low level as an active state, the signals PEO and OE have a high level, respectively.

In FIG. 6, a conventional data output circuit comprised in the circuit 122 is illustrated which is associated with a data input/output pin whose value is toggled in the synchronization with the output enable signal OE# during the status read operation. As seen from the table, the values of the pins DQ2 and DQ6 are toggled as the signal OE# is toggled during an erase operation. During the program operation, the value of the pin DQ2 is not toggled while the value of the pin DQ6 is toggled. In FIG. 6, the data output circuit associated with the pin DQ2 is illustrated, but that associated with the pin DQ6, whose value is toggled according to the signal OE#, is also configured the same as FIG. 6. The data output circuit 122 outputs a cell data signal from the sense amplifier 110 in FIG. 1 in synchronization with the signal POE during a normal read operation, and outputs a status data signal synchronized with the signal POE in response to the signal OE and a flag signal STATUS_EN during the status read operation. The flag signal STATUS_EN is activated high when a command associated with a program/erase operation except for a read operation is provided to the flash memory.

The data output circuit 122 includes a status data signal generator 124 which is composed of two inverters INV3 and INV4 and a S-R flip flop, a selector or a multiplexer 126 which is composed of two transmission gates TG1 and TG2, a PMOS transistor MP1 functioning as a pull-up transistor, a NMOS transistor MN1 functioning as a pull-down transistor, an inverter INV5, a NAND gate G2 for driving the pull-up transistor and a NOR gate G3 for driving the pull-down transistor, connected as illustrated in FIG. 6. The S-R flip flop has three inputs S, R and CLK and two outputs Q and Q#. The input S of the flip flop is directly coupled to its output Q#, and thereby the S-R flip flop functions as a D flip flop.

FIG. 7 is a timing diagram for describing a status read operation of the flash memory.

In operation, when the flag signal STATUS_EN is at a low level, that is at a normal read operation, the transmission gate TG1 is activated and the transmission gate TG2 is inactivated. A cell data signal CDS is transferred to first inputs of the gates G2 and G3 through the transmission gate TG1, respectively. If the signal CDS is at a low level, the pull-down transistor MN1 is turned on in synchronization with a low-to-high transition of the signal POE. If the signal CDS is at a high level, the pull-up transistor MP1 is turned on in synchronization with a low-to-high transition of the signal POE.

When the flag signal STATUS_EN is at a high level and the output enable signal OE# is toggled to read its status of operation, a status data signal SDS from of the status data signal generator 124 is toggled between a high level and a low level in synchronization with a rising edge of the signal OE from the OE buffer 130. In particular, whenever the signal OE transitions from a low level to a high level, the status data signal SDS is toggled from a low level to a high level or from a high level to a low level. Since the flag signal STATUS_EN is at a high level, the transmission gate TG1 is inactivated and the transmission gate TG2 is activated. The status data signal SDS from the status data signal generator 124 is transferred to the first inputs of the gates G2 and G3 through the transmission gate TG2, respectively. In a case where the signal POE is at a low level, the output pin DQ2/6 is maintained at a high impedance regardless of a logic level of a signal from the selector 126. On the other hand, when the signal POE is at a high level, a value of the output pin DQ2/6 is pulled up to a high level or down to a low level according to the logic level of the signal from the selector 126, that is, the status data signal SDS.

As can be seen from FIG. 7, the status data signal SDS transitions after a delay time $t_D$ from a low-to-high transition of the signal OE elapses. The delay time $t_D$ is about 5 ns (nanosecond) which is determined by a path from an output of the OE buffer 130 to an input of the driver G2 or G3. The delay time $t_D$ causes a racing problem between the signal POE and the status data signal SDS. As depicted by a dot line in FIG. 7, an abnormal period of the output signal DQ2/6 is generated owing to the racing between the signals POE and SDS. This results a power noise and an unnecessary power consumption. Such a power noise may affect an internal erase/program operation.

In general, since external loading of a data input/output pin is very large (e.g., 30 pF to 100 pF), a power noise (a power supply voltage or a ground voltage noise) is made at the value of the data input/output pin is toggled. As described above, such a power noise affects an internal erase/program operation. Therefore, it is preferable to minimize the number of toggled pins during the status read operation.

In FIG. 8, a data output circuit is illustrated which is not associated with the status read operation (or is reserved during the status read operation). The data output circuit 128 is composed of a PMOS transistor MP2 functioning as a pull-up transistor, a NMOS transistor MN2 functioning as a pull-down transistor, an inverter INV6, a NAND gate G4 for driving the pull-up transistor and a NOR gate G5 for driving the pull-down transistor, connected as illustrated in FIG. 8. The data output circuit 128 outputs a cell data signal CDS in response to the signal POE. When the status read operation is performed, that is, when the output enable signal OE# is toggled during an erase/program operation, a value of the pin coupled to the circuit 128 can be toggled by both a cell data signal CDS and the signal POE. Similarly, this causes a power noise and an unnecessary power consumption.

SUMMARY OF THE INVENTION

It is therefore an object of the invention to provide a flash memory capable of reducing a power noise and an unnecessary power consumption caused during a status read operation.

According to another aspect of this invention, there is provided a flash memory device having a status read operation for indicating its status of operation. The memory device comprises a memory cell array for storing data information; a plurality of data input/output pins divided into a first group and a second group; a first group of data output circuits each coupled to corresponding data input/output pins of the first group, wherein status data signals associated with the status read operation are outputted via the data input/output pins of the first group; and a second group of data output circuits each coupled to corresponding data input/output pins of the second group, wherein the data input/output pins of the second group are reserved during the status read operation, wherein a data output circuit coupled to at least one of the data input/output pins of the first group generates a toggled status data signal so that the toggled status data signal to be outputted via the at least one pin at an Nth cycle of an output enable signal is generated at a (N-1)th cycle of the output enable signal during the status read operation; and wherein each of the data input/output pins of the second group is maintained at a predetermined state by a corresponding data input/output circuit during the status read operation.

BRIEF DESCRIPTION OF THE DRAWINGS

A more complete appreciation of the present invention, and many of the attendant advantages thereof, will become readily apparent as the same becomes better understood by reference to the following detailed description when considered in conjuction with the accompanying drawings in which like reference symbols indicate the same or similar components, wherein.

DESCRIPTION OF THE PREFERRED EMBODIMENT

The preferred embodiments of the invention will be more fully described with reference to the attached drawings.

Figure 1:
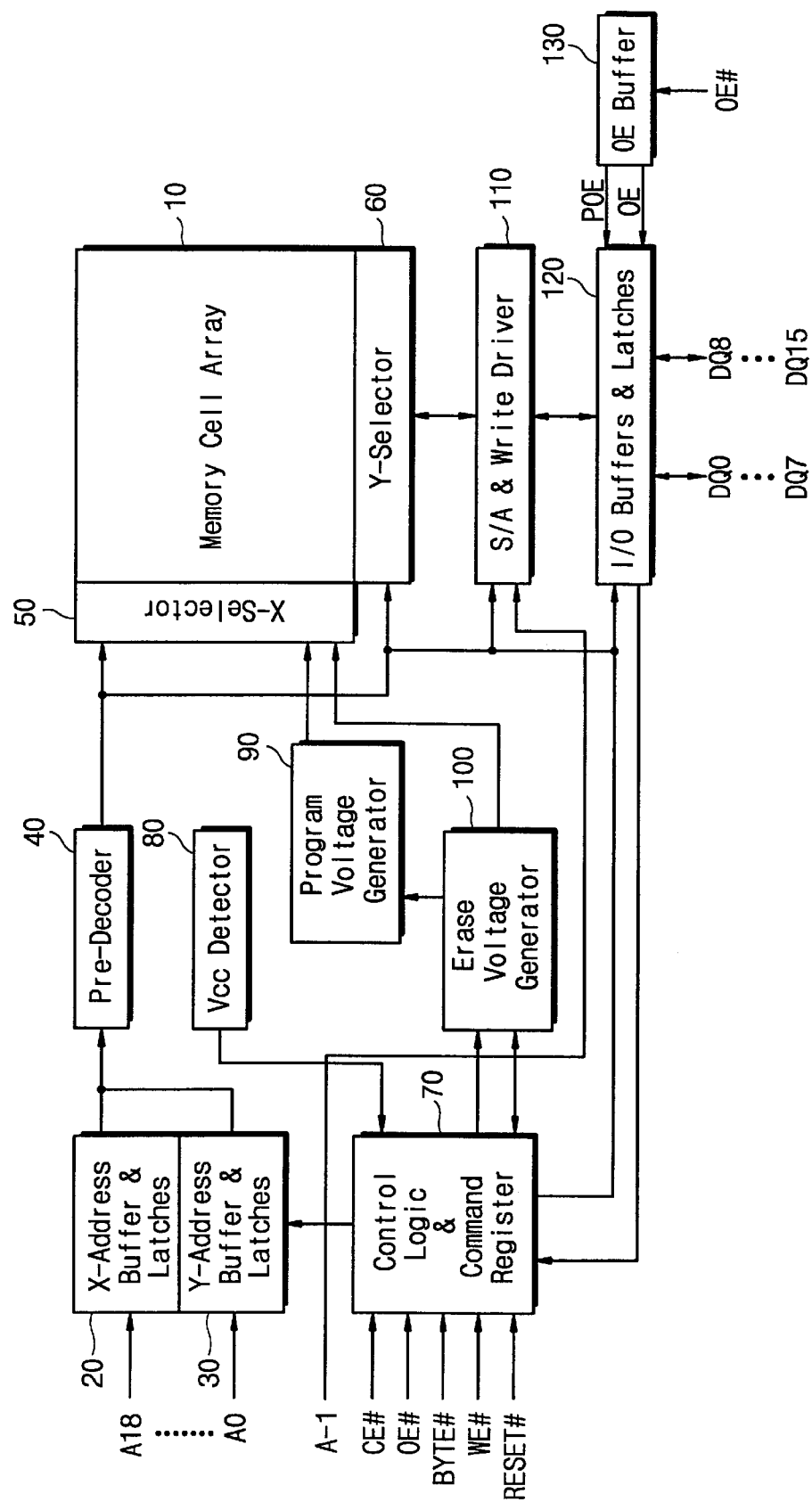
FIG. 1 is a block diagram of a conventional flash memory.
Figure 2:
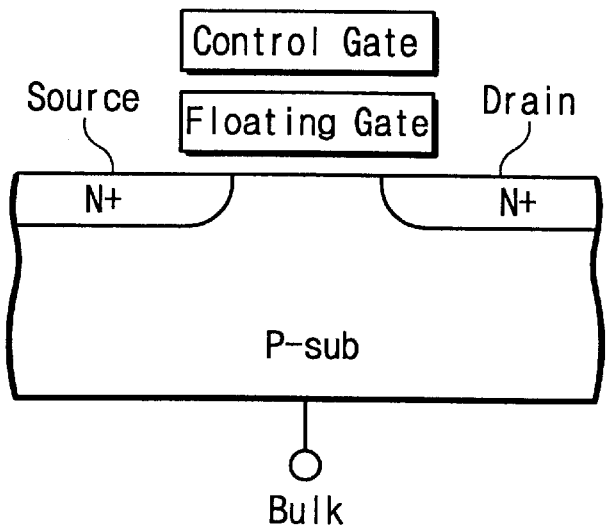
FIG. 2 is a cross-sectional diagram of an electrically erasable and programmable memory cell transistor.
Figure 3:
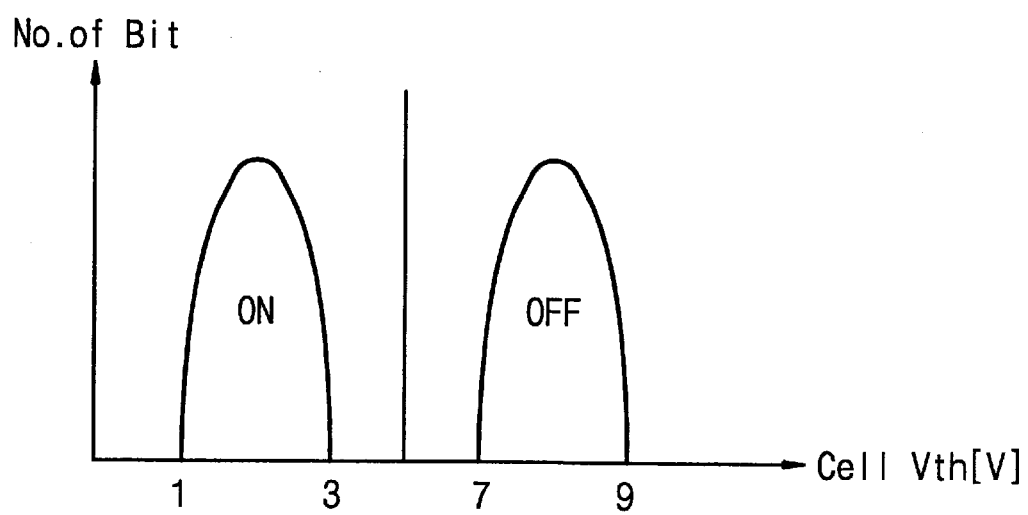
FIG. 3 is a diagram showing threshold voltage distributions of ON and OFF cell transistors.
Figure 4:
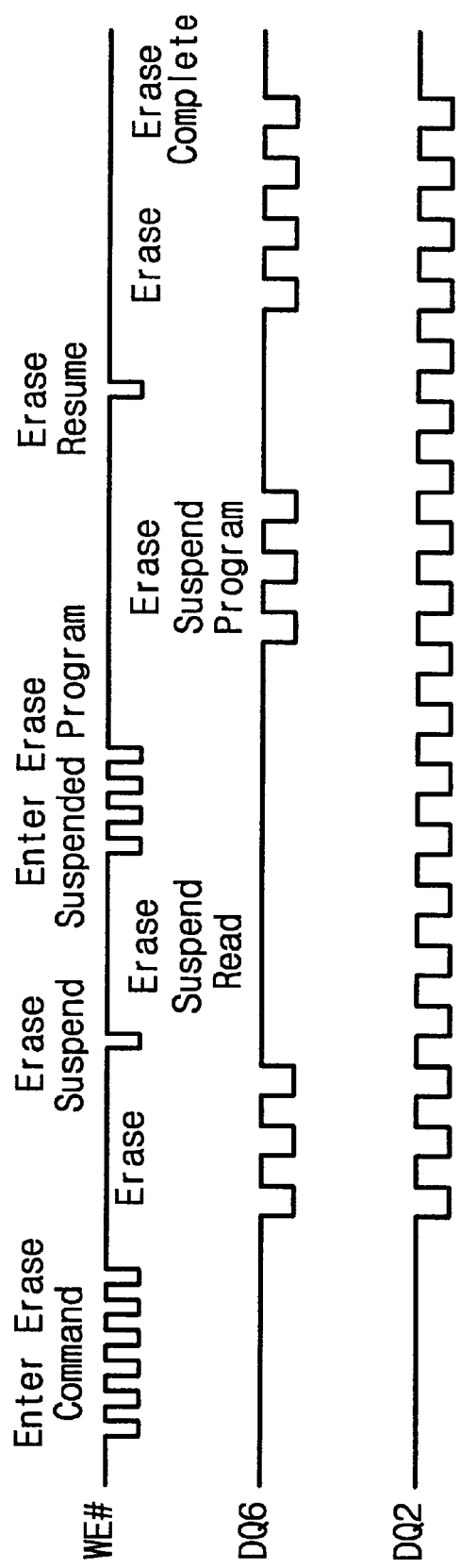
FIG. 4 is a diagram showing values of data input/output pins according to each status of operation of the flash memory.
Figure 5:
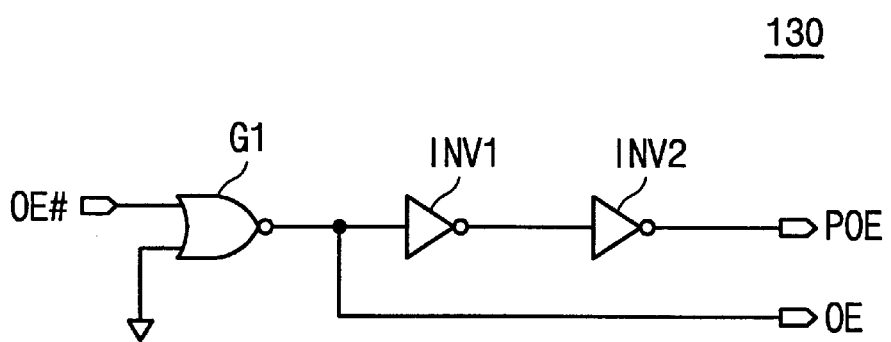
FIG. 5 is a circuit diagram of an output enable buffer illustrated in FIG. 1.
Figure 6:
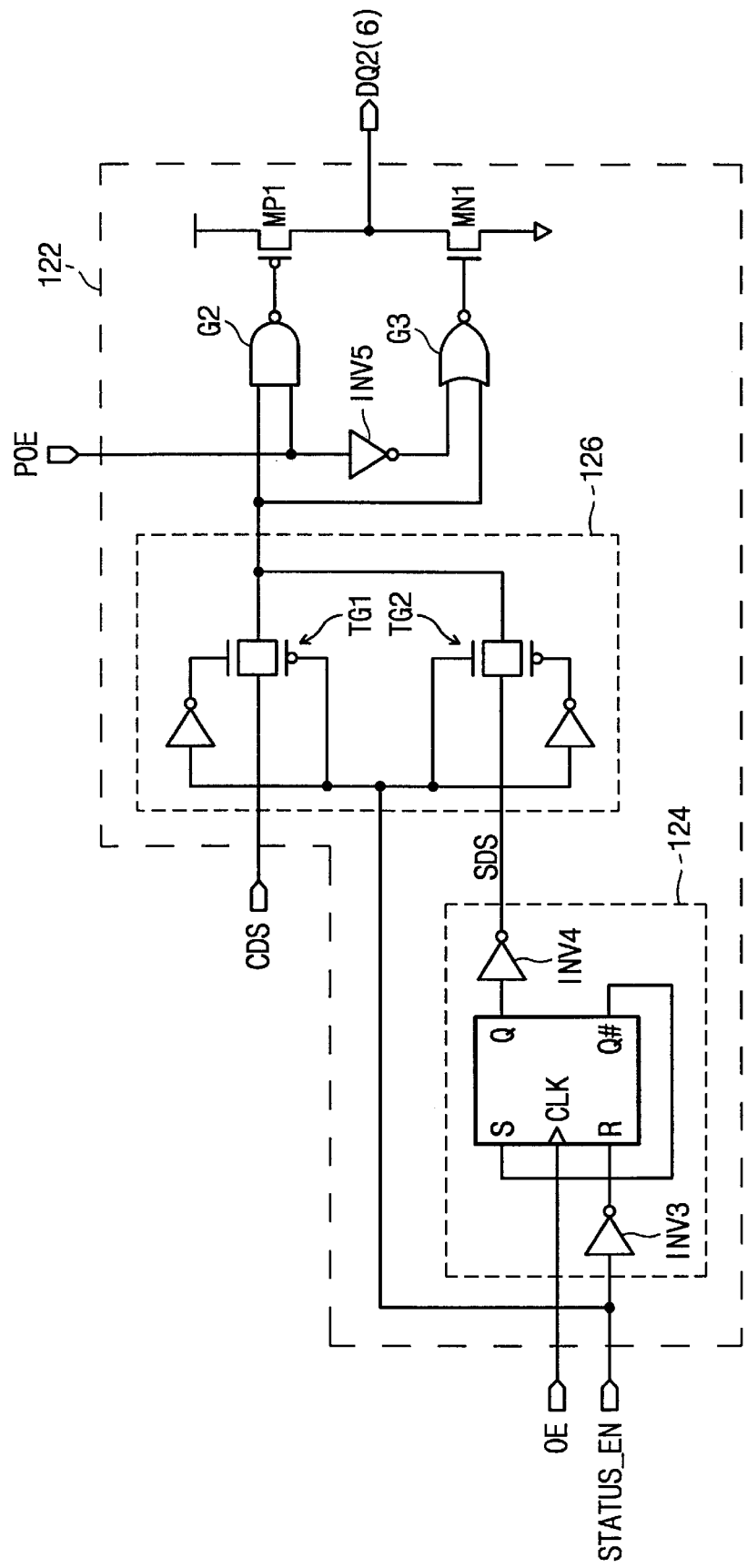
FIG. 6 is a circuit diagram of a data output circuit, which is associated with a data input/output pin toggled during a status read operation, according to a conventional art.
Figure 7:
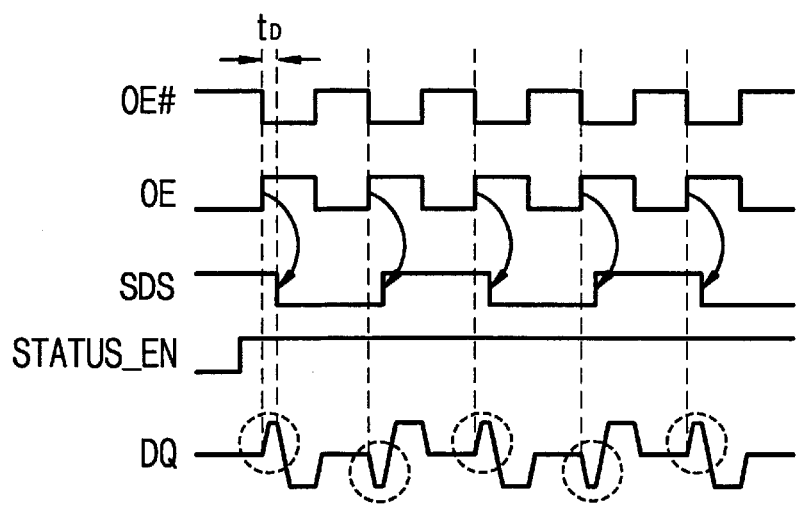
FIG. 7 is a timing diagram for describing a status read operation.
Figure 8:
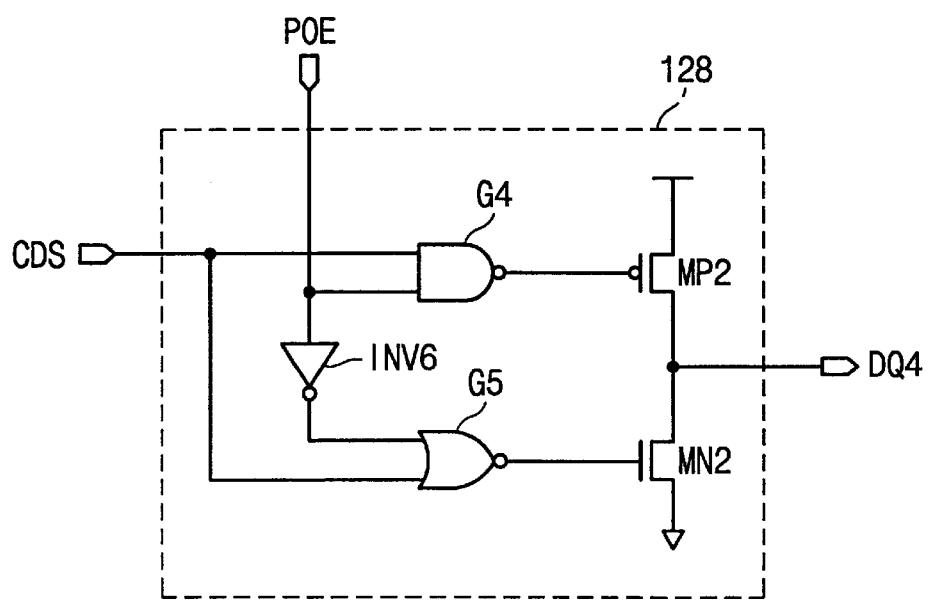
FIG. 8 is a circuit diagram of a data output circuit, which is associated with a data input/output pin not toggled during a status read operation, according to a conventional art.
Figure 9:
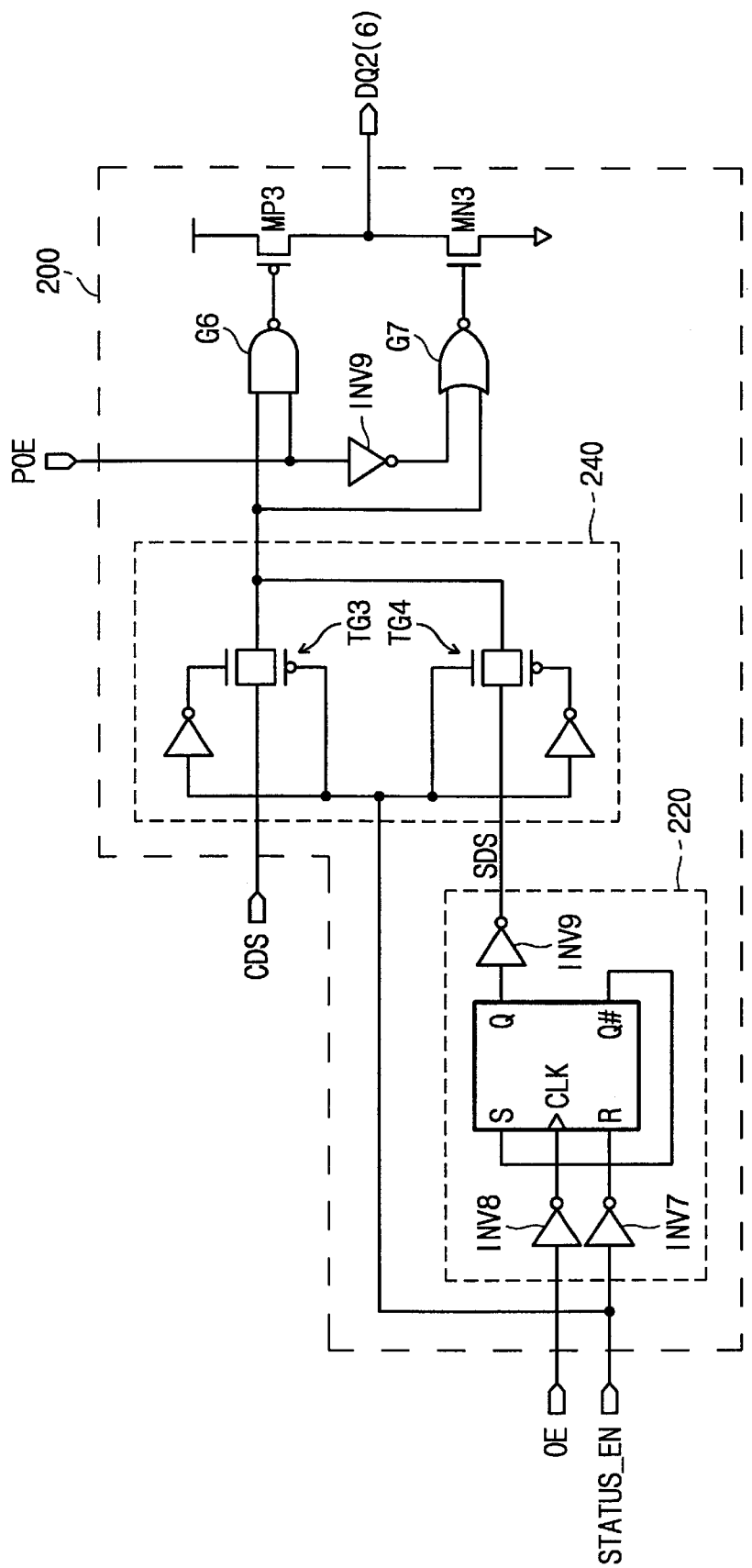
FIG. 9 is an embodiment of a data output circuit, which is associated with a data input/output pin toggled during a status read operation, according to the present invention.

In FIG. 9, an embodiment of a data output circuit according to the present invention is illustrated. The data output circuit 200 is coupled to a data input/output pin DQ2 or DQ6, which outputs a toggled status data signal during a status read operation. The data output circuit 200 comprises a status data signal generator 220, a multiplexer or a selector 240, an inverter INV9, a PMOS transistor MP3 functioning as a pull-up transistor, an NMOS transistor MN3 functioning as a pull-down transistor, a NAND gate G6 for driving the PMOS transistor MP3, and a NOR gate G7 for driving the NMOS transistor MN3.

Three inverters INV8, INV9, and INV10 and a S-R flip flop constitute the status data signal generator 220. The S-F flip flop has three inputs S, R and CLK and two outputs Q and Q# (wherein the symbol # means a complementary signal). The S-R flip flop functions as a D flip flop by connecting the input S and the output Q# directly. According to this configuration, since a logic level of the status data signal SDS is previously determined at a falling edge of the signal OE (that is, the toggled status data signal to be outputted at an Nth cycle of an output enable signal OE# is generated at a (N-1)th cycle of the output enable signal OE# during the status read operation), the aforementioned racing problem between the signals SDS and POE is not caused. This will be more fully described below.

The selector or multiplexer 240 is constituted of two transmission gates TG3 and TG4, and selects either one of the cell data signal CDS and the status data signal SDS in response to the flag signal STATUS_EN. The NAND gate G6 drives the PMOS transistor MP3 in response to the signal POE and an output signal of the selector 240, and the NOR gate G7 drives the NMOS transistor MN3 in response to an inverted version of the signal POE and the output signal of the selector 240.

Figure 10:
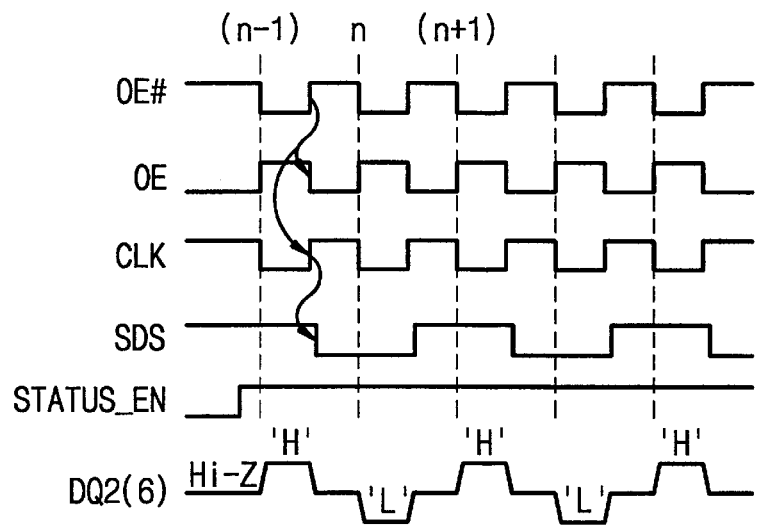
FIG. 10 is a timing diagram for describing a status read operation.

FIG. 10 is a timing diagram for describing a status read operation of a flash memory.

When the flag signal STATUS_EN is at a low level, that is, at a normal read operation, the transmission gate TG3 is activated and the transmission gate TG4 is inactivated. A cell data signal CDS is transferred to first inputs of the gates G6 and G7 through the transmission gate TG3, respectively. If the signal CDS is at a low level, the pull-down transistor MN3 is turned on in synchronization with a low-to-high transition of the signal POE. If the signal CDS is at a high level, the pull-up transistor MP3 is turned on in synchronization with a low-to-high transition of the signal POE.

After the flag signal STATUS_EN transitions from a low level to a high level, that is, a command for a program/erase operation is supplied to the flash memory, the output enable signal OE# is toggled in order to judge its status of operation. The status data signal generator 220 generates a status data signal SDS toggled between a high level and a low level in synchronization with a falling edge of the signal OE or with a rising edge of an signal OE#. In particular, whenever the signal OE transitions from a high level to a low level (or the signal OE# transitions from a low level to a high level), the status data signal SDS is toggled as illustrated in FIG. 10.

Since the flag signal STATUS_EN is at a high level, the transmission gate TG3 is inactivated and the transmission gate TG4 is activated. The status data signal SDS from the status data signal generator 220 is transferred to the first inputs of the gates G6 and G7 through the transmission gate TG4, respectively. When the signal POE is at a high level, the output DQ2/6 is pulled up to a high level or down to a low level according to the logic level of the signal from the selector 240, that is, the status data signal SDS. On the other hand, in a case where the signal POE is at a low level, the output DQ2/6 is maintained at a high impedance regardless of a logic level of a signal from the selector 240.

Accordingly, in order to solve the racing problem between the signals SDS and POE. a logic level of the status data signal SDS is previously determined. In other word, a status data signal to be outputted at an Nth cycle of an output enable signal OE# is generated at a (N-1)th cycle of the output enable signal OE# during the status read operation.

As a result, a power noise and an unnecessary power consumption owing to the racing phenomenon can be prevented.

Figure 11:
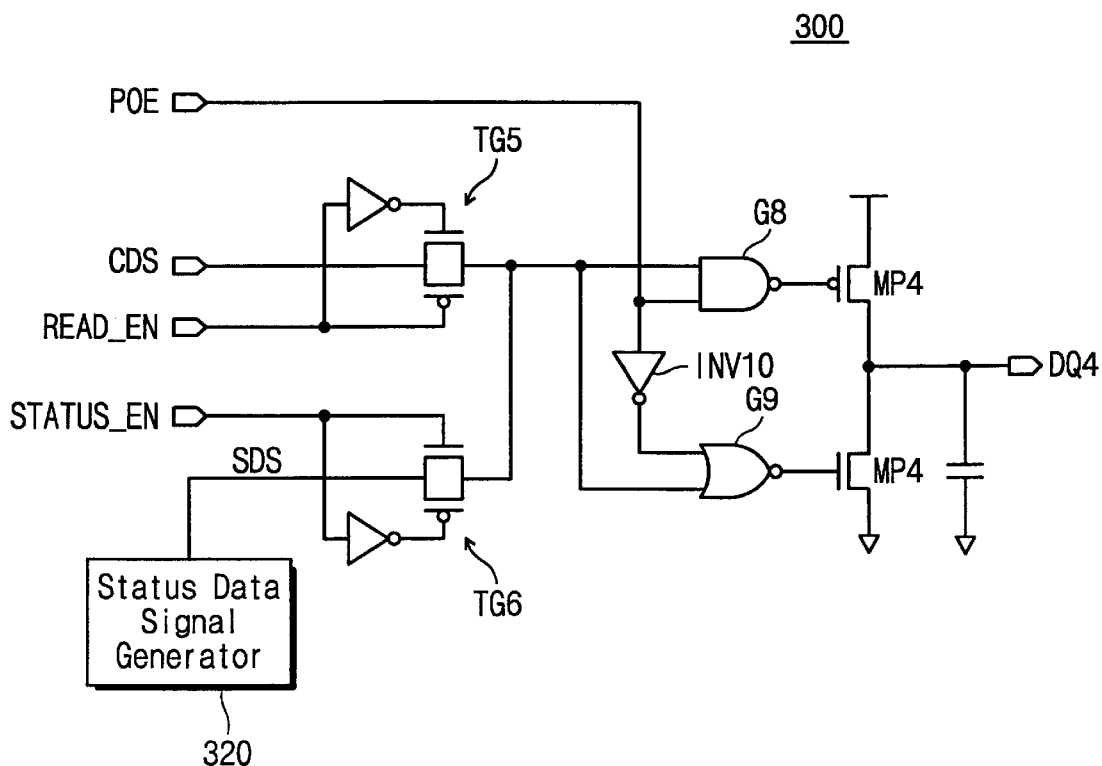
FIG. 11 is an embodiment of a data output circuit, which is associated with a reserved pin, according the present invention.

In FIG. 11, an embodiment of a data output circuit according to the present invention is illustrated. The data output circuit 300 is coupled to a data input/output pin (e.g., DQ4) which is reserved during a status read operation (hereinafter, referred to as "a reserved pin"). The data output circuit 300 associated with the reserved pin comprises a status data signal generator 320, two transmission gates TG5 and TG6, an inverter INV10, a NAND gate G8, a NOR gate G9, a PMOS transistor MP4 and an NMOS transistor MN4.

The status data signal generator 320 produces a status data signal SDS not toggled, but having logically "1" or "0". The status data signal generator 320, for example, can be configured by a PMOS transistor which is turned on and off according to an inverted version of the flag signal STATUS_EN so as to output a signal SDS of –1=, or by an NMOS transistor which is turned on and off according to the flag signal STATUS_EN so as to output a signal SDS of –0=. The signal READ_EN indicates that the flash memory performs a normal read operation. Thus, the signal READ_EN has a high level for the normal read operation, and a low level for a program/erase operation. In other word, when a read operation is performed the signal READ_EN is activated high while the flag signal STATUS_EN is inactivated low. When another operation (e.g., erasing or programming) except for the read operation is performed, the signal READ_EN is inactivated low while the flag signal STATUS_EN is activated high.

In operation, in order to read a present status of operation for a flash memory, an output enable signal OE# is togged. Since the flag signal STATUS_EN is at a high level, the transmission gate TG6 is activated and the transmission gate TG5 is inactivated. In the case that an output signal SDS of the generator 320 is set low, the PMOS transistor MP4 is turned off regardless of the signal POE, while the NMOS transistor MN4 is turned on during a high period of the signal POE. As a result, the reserved pin DQ4 is maintained at an high impendence during a low period of the signal POE and is maintained at a low level during a high period thereof.

Figure 12:
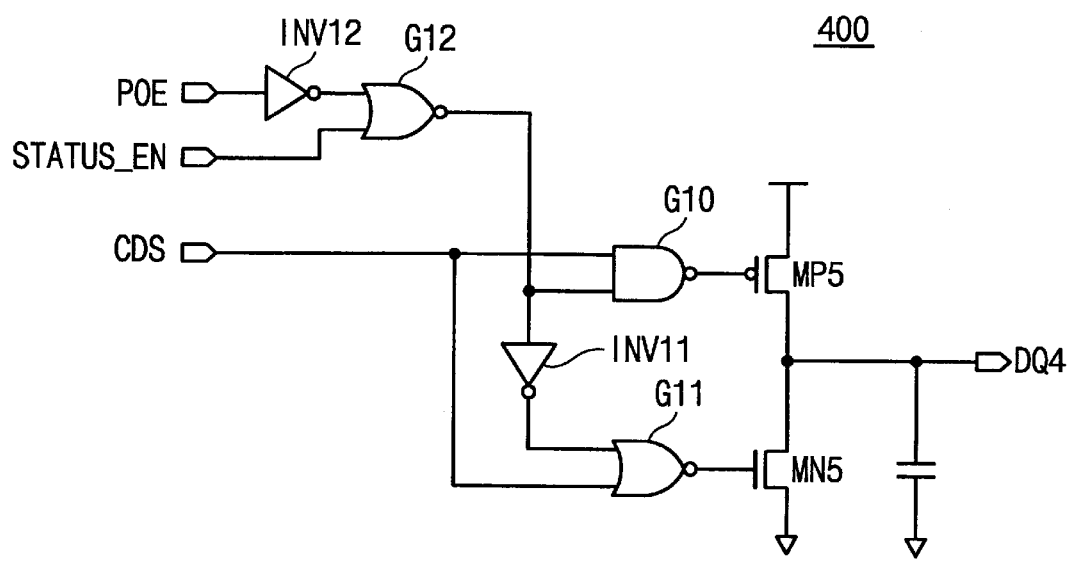
FIG. 12 is another embodiment of the data output circuit, which is associated with a reserved pin, according to the present invention.

As above described, reserved ones of data input/output pins are set "1" or "0" during a status read operation. On the other hand, by setting the reserved pins to a high impendence state, the above-described problem can be prevented. As illustrated in FIG. 12, when the flag signal STATUS_EN is enabled high, the PMOS transistor MP5 and the NMOS transistor MN5 are turned off regardless of the signal POE. The reserved pin DQ4 has the high impendence state during the status read operation. As a result, there can be prevented a power noise and a power consumption owing to unnecessary cell data signals during the status read operation.

The invention has been described using exemplary preferred embodiments. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A flash memory device having a status read operation for indicating its status of operation comprises:
   a memory cell array for storing data information;
   a plurality of data input/output pins divided into a first group and a second group;
   a first group of data output circuits each coupled to corresponding data input/output pins of the first group, wherein status data signals associated with the status read operation are outputted via the data input/output pins of the first group; and
   a second group of data output circuits each coupled to corresponding data input/output pins of the second group, wherein the data input/output pins of the second group are reserved during the status read operation,
   wherein a data output circuit coupled to at least one of the data input/output pins of the first group generates a toggled status data signal so that the toggled status data signal to be outputted via the at least one pin at an Nth cycle of an output enable signal (OE#) is generated at a (N-1)th cycle of the output enable signal (OE#) during the status read operation, and
   wherein each of the data input/output pins of the second group is maintained at a predetermined state by a corresponding data input/output circuit during the status read operation.

2. The flash memory device according to claim 1, further comprises an output enable buffer circuit for generating a first output enable signal (OE) and a second output enable signal (POE) in response to the output enable signal (OE#), wherein the first and second output enable signals have the same phase.

3. The flash memory device according to claim 2, wherein the data output circuit coupled to the at least one data input/output pin comprises:
   a status data signal generator enabled by a flag signal (STATUS_EN) indicating the status read operation, for producing a status data signal so as to be toggled at a high-to-low transition of the first output enable signal (OE);
   a multiplexer for selecting either one of a cell signal from the memory cell array and the status data signal in response to the flag signal (STATUS_EN); and
   an output buffer for driving a corresponding data input/output pin according to a signal selected by the multiplexer when the second output enable signal (POE) transitions from a low level to a high level.

4. The flash memory device according to claim 3, wherein the status data signal generator comprises:
   a S-R flip flop having three inputs (S, R and CLK) and two outputs (Q and Q#), the input (S) directly coupled to the output (Q#) so as to function as a D flip flop;
   a first inverter having an input coupled to receive the first output enable signal (OE) and an output coupled to the input (CLK) of the flip flop;
   a second inverter having an input coupled to receive the flag signal (STATUS_EN) and an output coupled to the input (R) of the flip flop; and
   a third inverter having an input coupled to the output (Q) of the flip flop and an output to output the status data signal.

5. The flash memory device according to claim 2, wherein each of the data output circuits corresponding to data input/output pins reserved during the status read operation comprises:
   a status data signal generator enabled by a flag signal (STATUS_EN) indicating the status read operation, for producing a status data signal having either one of a logic high level and a logic low level;
   a multiplexer for selecting either one of a cell data signal from the memory cell array and the status data signal from the status data signal in response to the flag signal (STATUS_EN); and an output buffer for driving a corresponding data input/output pin according to a signal selected by the multiplexer when the second output enable signal (POE) transitions from a low level to a high level.

6. The flash memory device according to claim 2, wherein each of the data output circuits corresponding to data input/output pins reserved during the status read operation is maintained at a high-impendence state.

7. The flash memory device according to claim 6, wherein each of the data output circuits corresponding to data input/output pins reserved during the status read operation comprises:

a NOR gate having one input receiving an inverted version of the first output enable signal (POE) and the other input receiving a flag signal (STATUS_EN) indicating the status read operation;

a pull-up transistor coupled between a power supply voltage and a corresponding data input/output pin;

a pull-down transistor coupled between the corresponding data input/output pin and a ground voltage;

a first driver for driving the pull-up transistor in response to an output signal of the NOR gate; and a second driver for driving the pull-down transistor in response to an inverted version of the output signal of the NOR gate.

* * * * *

UNITED STATES PATENT AND TRADEMARK OFFICE
CERTIFICATE OF CORRECTION

PATENT NO.   : 6,249,461 B1              Page 1 of 1
DATED        : June 19, 2001
INVENTOR(S)  : Choi et al.

It is certified that error appears in the above-identified patent and that said Letters Patent is hereby corrected as shown below:

Column 2,
Line 11, "100 66" should read -- 100Δ --.

Column 3,
Line 13, "PEO" should read -- POE --.

Column 6,
Line 4, "S-F flip flop" should read -- S-R flip flop --.

Column 7,
Line 18, "-1=," should read -- '1' --.
Line 20, "-0=," should read -- '0' --.
Line 32, "togged" should read -- toggled --.

Column 8,
Line 37, "cell signal" should read -- cell data signal --.

Signed and Sealed this

Sixteenth Day of April, 2002

Attest:

Attesting Officer

JAMES E. ROGAN
Director of the United States Patent and Trademark Office